United States Patent
Kaes et al.

(10) Patent No.: US 8,298,850 B2
(45) Date of Patent: Oct. 30, 2012

(54) BIFACIAL SOLAR CELLS WITH OVERLAID BACK GRID SURFACE

(75) Inventors: Martin Kaes, Berlin (DE); Peter Borden, San Mateo, CA (US); Kamel Ounadjela, Belmont, CA (US); Andreas Kraenzl, Radolfzell (DE); Alain Blosse, Belmont, CA (US); Fritz G. Kirscht, Berlin (DE)

(73) Assignee: Silicor Materials Inc., Palo Alto, CA (US)

( * ) Notice: Subject to any disclaimer, the term of this patent is extended or adjusted under 35 U.S.C. 154(b) by 659 days.

(21) Appl. No.: 12/456,378

(22) Filed: Jun. 15, 2009

(65) Prior Publication Data

US 2010/0275983 A1    Nov. 4, 2010

Related U.S. Application Data

(60) Provisional application No. 61/215,199, filed on May 1, 2009.

(51) Int. Cl.
*H01L 21/00* (2006.01)
(52) U.S. Cl. .................. 438/72; 257/E31.128
(58) Field of Classification Search ............. 438/72; 257/E31.128
See application file for complete search history.

(56) References Cited

U.S. PATENT DOCUMENTS

| | | | |
|---|---|---|---|
| 4,468,853 A | 9/1984 | Morita et al. | |
| 4,994,879 A | 2/1991 | Hayashi | |
| 5,665,175 A | 9/1997 | Safir | |
| 6,096,968 A | 8/2000 | Schlosser et al. | |
| 7,495,167 B2 | 2/2009 | Joge et al. | |
| 2004/0063326 A1* | 4/2004 | Szlufcik et al. | 438/695 |
| 2005/0016585 A1 | 1/2005 | Munzer | |
| 2005/0056312 A1 | 3/2005 | Young et al. | |
| 2005/0133084 A1 | 6/2005 | Joge et al. | |
| 2007/0137699 A1 | 6/2007 | Manivannan et al. | |
| 2008/0257399 A1 | 10/2008 | Wong et al. | |
| 2010/0275984 A1 | 11/2010 | Kaes et al. | |
| 2010/0275995 A1 | 11/2010 | Kaes et al. | |

FOREIGN PATENT DOCUMENTS

| | | |
|---|---|---|
| JP | 2007300128 A1 | 11/2007 |
| WO | WO/2008/039067 | 4/2008 |
| WO | WO-2010126572 A2 | 11/2010 |
| WO | WO-2010126571 A3 | 1/2011 |

(Continued)

OTHER PUBLICATIONS

T. Warabisako et al, Bifacial Multicrystalline Silicon Solar Cells, Photovoltaic Specialists Conference, May 10-14, 1993, Conference Record of the Twenty Third IEEE, pp. 248-251.

(Continued)

*Primary Examiner* — Matthew Reames
(74) *Attorney, Agent, or Firm* — Schwegman Lundberg & Woessner, P.A.

(57) ABSTRACT

A simplified manufacturing process and the resultant bifacial solar cell (BSC) are provided, the simplified manufacturing process reducing manufacturing costs. The BSC includes an active region located on the front surface of the substrate, formed for example by a phosphorous diffusion step. After removing the PSG, assuming phosphorous diffusion, and isolating the front junction, dielectric layers are deposited on the front and back surfaces. Contact grids are formed, for example by screen printing. Prior to depositing the back surface dielectric, a metal grid may be applied to the back surface, the back surface contact grid registered to, and alloyed to, the metal grid during contact firing.

16 Claims, 5 Drawing Sheets

FOREIGN PATENT DOCUMENTS

| WO | WO-2010126572 A3 | 1/2011 |
|---|---|---|
| WO | WO-2010126570 A3 | 2/2011 |

OTHER PUBLICATIONS

J. Schmidt et al, Record Low Surface Recombination Velocities on Low-Resistivity Silicon Solar Cell Substrates, Photovoltaic Specialists Conference, May 13-17, 1996, Conference Record of the Twenty Third IEEE, pp. 413-416.

D.S. Kim et al, Silicon Solar Cells with Boron Back Surface Field Formed by Using Boric Acid, 22nd European Photovoltaic Solar Energy Conference, Sep. 3-7, 2007.

R.R. King et al, Back Surface Cell Structures for Reducing Recombination in CZ Silicon Solar Cells, IEEE Photovoltaic Specialists Conference, Dec. 5-9, 1994, Conference Record of the Twenty Fourth IEEE, pp. 1291-1294.

F. Huster et al, ECV Doping Profile Measurement of Aluminum Alloyed Back Surface Fields, 20th European Photovoltaic Solar Energy Conference, Jun. 6-10, 2005.

"International Application PCT/US2010/001173 Search Report mailed Dec. 10, 2010", 3 pgs.

"International Application PCT/US2010/001173, Written Opinion mailed Dec. 10, 2010", 4 pgs.

"International Application PCT/US2010/001174, Search Report mailed Nov. 30, 2010", 3 pgs.

"International Application PCT/US2010/001174, Written Opinion mailed Nov. 30, 2010", 5 pgs.

"International Application PCT/US2010/001175, Written Opinion mailed Dec. 6, 2010", 6 pgs.

"International Application PCT/US2010/001175,Search Report mailed Dec. 6, 2010", 3 pgs.

Hubner, A., et al., "Novel cost-effective bifacial silicon solar cells with 19.4% front and 18.1% rear efficiency", Applied Physics Letters, 70(8), See pp. 1009-1010 and figure 3, (Feb. 24, 1997), 1008-1010.

Kranzl, A., et al., "Bifacial Solar Cells on Multi-Crystalline Silicon with Boron BSF and Open Rear Contact", Conference Record of the 2006 IEEE 4th World Conference on Photovoltaic Energy Conversion, See pp. 968-969 and figures 2,6, (May 30, 2006), 968-971.

Ponce-Alcantara, S., et al., "Surface passivation layers for multicrystalline silicon solar cells", 2005 Spanish Conference on Electron Devices, (2005), 295-298.

Schmidt, J., et al., "Record low surface recombination velocities on low-resistivity silicon solar cell substrates", Conference Record of the Twenty Fifth IEEE Photovoltaic Specialists Conference, 1996, (1996), 413-416.

Warabisako, T., et al., "Bifacial multicrystalline silicon solar cells", Conference Record of the Twenty Third IEEE Photovoltaic Specialists Conference, 1993., See abstract and experimenta I, figures 1 and 2, (May 1993), 248-251.

"U.S. Appl. No. 12/456,398, Non Final Office Action mailed Mar. 1, 2012", 13 pgs.

"U.S. Appl. No. 12/456,398, Restriction Requirement mailed Nov. 10, 2011", 6 pgs.

"U.S. Appl. No. 12/456,404, Advisory Action mailed Dec. 23, 2011", 3 pgs.

"U.S. Appl. No. 12/456,404, Final Office Action mailed Oct. 18, 2011", 11 pgs.

"U.S. Appl. No. 12/456,404, Non Final Office Action mailed Mar. 2, 2012", 11 pgs.

"U.S. Appl. No. 12/456,404, Non Final Office Action mailed Jun. 24, 2011", 13 pgs.

"U.S. Appl. No. 12/456,404, Response filed Dec. 16, 2011 to Final Office Action mailed Oct. 18, 2011", 9 pgs.

"U.S. Appl. No. 12/456,404, Response filed Sep. 26, 2011 to Non Final Office Action mailed Jun. 24, 2011", 9 pgs.

"International Application PCT/US2010/001173, International Preliminary Report on Patentability mailed Nov. 10, 2011", 6 pgs.

"International Application PCT/US2010/001174, International Preliminary Report on Patentability mailed Nov. 10, 2011", 7pgs.

"International Application PCT/US2010/001175, International Preliminary Report on Patentability mailed Nov. 10, 2011", 8 pgs.

* cited by examiner

BIFACIAL SOLAR CELLS WITH OVERLAID BACK GRID SURFACE

CROSS-REFERENCE TO RELATED APPLICATION

This application claims the benefit of the filing date of U.S. Provisional Patent Application Ser. No. 61/215,199, filed May 1, 2009, the disclosure of which is incorporated herein by reference for any and all purposes.

FIELD OF THE INVENTION

The present invention relates generally to solar cells and, in particular, to an improved structure and manufacturing process for a bifacial solar cell.

BACKGROUND OF THE INVENTION

Bifacial solar cells (BSC) may use any of a variety of different designs to achieve higher efficiencies than those typically obtained by a conventional, monofacial solar cell. One such design is shown in U.S. Pat. No. 5,665,175 which discloses a BSC configuration with first and second active regions formed on the front and back surfaces of the BSC, respectively, the two regions separated by a distance λ. The distance λ allows a leakage current to flow between the first and second active regions, thus allowing a solar cell panel utilizing such bifacial cells to continue to operate even if one or more individual solar cells become shaded or defective.

U.S. Pat. No. 7,495,167 discloses an $n^+pp^+$ structure and a method of producing the same. In the disclosed structure, the $p^+$ layer, formed by boron diffusion, exhibits a lifetime close to that of the initial level of the substrate. In order to achieve this lifetime, the '167 patent teaches that after phosphorous gettering, the cell must be annealed at a temperature of 600° C. or less for one hour or more. In order to retain the lifetime recovered by the phosphorous and low-temperature born gettering steps, the cell then undergoes a final heat treatment step in which the cell is fired at a temperature of around 700° C. or less for one minute or less.

U.S. Patent Application Publication No. 2005/0056312 discloses an alternative technique for achieving two or more p-n junctions in a single solar cell, the disclosed technique using transparent substrates (e.g., glass or quartz substrates). In one disclosed embodiment, the BSC includes two thin-film polycrystalline or amorphous cells formed on opposing sides of a transparent substrate. Due to the design of the cell, the high temperature deposition of the absorber layers can be completed before the low temperature deposition of the window layers, thus avoiding degradation or destruction of the p-n junctions.

Although there are a variety of BSC designs and techniques for fabricating the same, these designs and techniques tend to be relatively complex, and thus expensive. Accordingly, what is needed is a solar cell design that achieves the benefits associated with bifacial solar cells while retaining the manufacturing simplicity of a monofacial solar cell. The present invention provides such a design.

SUMMARY OF THE INVENTION

The present invention provides a simplified manufacturing process and the resultant bifacial solar cell (BSC), the simplified manufacturing process reducing manufacturing costs. In at least one embodiment of the invention, the manufacturing method is comprised of the steps of simultaneously diffusing phosphorous onto the front surface of a silicon substrate to form an $n^+$ layer and a front surface junction and onto the back surface of the silicon substrate to form an $n^+$ layer and a back surface junction, removing the phosphor-silicate glass formed during the diffusion step (e.g., by etching with HF), depositing passivation and AR dielectric layers on the front and back surfaces, applying front and back surface contact grids, and firing the front and back surface contact grids. The front and back surface contact grid firing steps may be performed simultaneously. Alternately, the back surface contact grid applying and firing steps may be performed prior to, or after, the front surface contact grid applying and firing steps. The method may further include the step of firing the back surface contact grid through the back junction, leaving a floating junction. The method may further include the step of removing the back surface junction and isolating the front surface junction, this step performed prior to depositing the back surface dielectric. A back surface metal grid may be applied, for example by screen printing or deposition using a shadow mask, after removing the back surface junction and prior to depositing the dielectric layer on the back surface.

In at least one embodiment of the invention, the manufacturing method is comprised of the steps of depositing a dielectric layer on the back surface of a silicon substrate, diffusing phosphorous onto the front surface of the substrate to form an $n^+$ layer and a front surface junction, removing the phosphor-silicate glass formed during the diffusion step (e.g., by etching with HF), isolating the front surface junction using a laser scriber, depositing a front surface passivation and AR dielectric layer, applying front and back surface contact grids, firing the front and back surface contact grids, and isolating the front surface junction, for example using a laser scriber. The front and back surface contact grid firing steps may be performed simultaneously. Alternately, the back surface contact grid applying and firing steps may be performed prior to, or after, the front surface contact grid applying and firing steps.

In at least one embodiment of the invention, a bifacial solar cell (BSC) is provided that is comprised of a silicon substrate with a front surface active region of a first conductivity type, dielectric layers deposited on the front surface active region and on the back surface of the silicon substrate, a front surface contact grid applied to the front surface dielectric, and a back surface contact grid applied to the back surface dielectric, where the front surface contact grid alloys through the front surface dielectric to the active region during firing, and where the back surface contact grid alloys through the back surface dielectric to the back surface of the silicon substrate during firing. The silicon substrate may be comprised of p-type silicon, the active region may be comprised of $n^+$ material resulting from a phosphorous diffusion step, and the dielectric layers may be comprised of silicon nitride, silicon oxide and/or silicon oxynitride. The BSC may further comprise a floating back surface junction of the first conductivity type. The BSC may further comprise a metal grid pattern deposited directly on the back surface of the silicon substrate, where the back surface screen printed contact grid fires through the back surface dielectric and makes electrical contact with the metal grid pattern during firing. The BSC may further comprise a groove on the front surface of the silicon substrate, the groove isolating the front surface junction.

A further understanding of the nature and advantages of the present invention may be realized by reference to the remaining portions of the specification and the drawings.

DESCRIPTION OF THE SPECIFIC EMBODIMENTS

Figure 1:
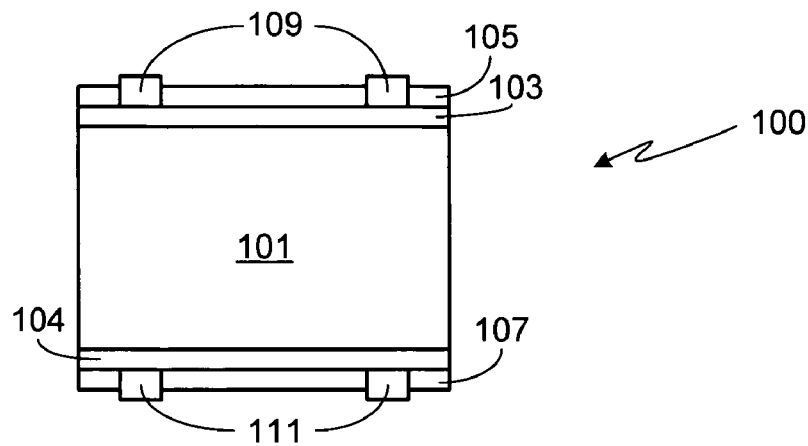
FIG. 1 illustrates a preferred embodiment of a BSC in accordance with the invention.
Figure 2:
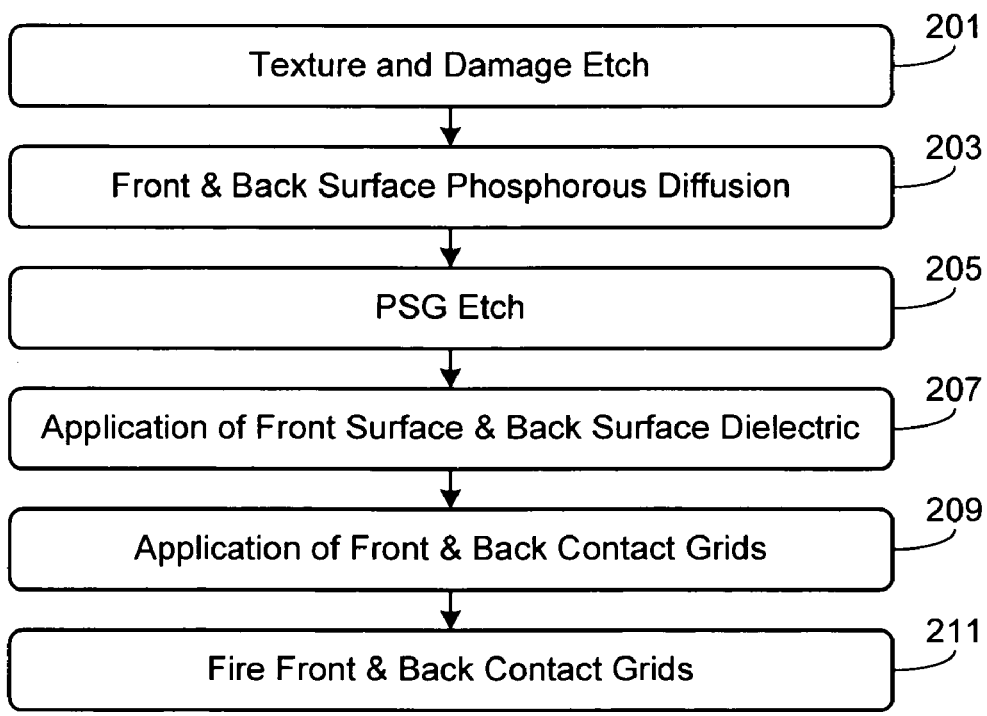
FIG. 2 illustrates the process flow for the BSC of FIG. 1.

FIG. 1 illustrates a cross-sectional view of a preferred bifacial solar cell (BSC) structure fabricated in accordance with the procedure described in FIG. 2. Silicon substrate 101 may be of either p- or n-type. In the illustrated device and process of FIGS. 1 and 2, a p-type substrate is used.

Initially, substrate 101 is prepared using any of a variety of well-known substrate preparatory processes (step 201). In general, during step 201 saw and handling induced damage is removed via an etching process, for example using a nitric and hydrofluoric (HF) acid mixture. After substrate preparation, phosphorous is diffused onto the front surface of substrate 101, creating $n^+$ layer 103 and a p-n junction at the interface of substrate 101 and $n^+$ layer 103. During this step, phosphorous is also diffused onto the back surface of substrate 101, creating $n^+$ layer 104 and a floating junction. Preferably $n^+$ layer 103 is formed using phosphoryl chloride ($POCl_3$) with a diffusion temperature in the range of 825° C. to 890° C., preferably at a temperature of approximately 850° C., for 10 to 20 minutes in a nitrogen atmosphere (step 203). The phosphor-silicate glass (PSG) formed during diffusion step 203 is then etched away, preferably using an HF etch at or near room temperature for 1 to 5 minutes (step 205). In the preferred embodiment, the front and back surface junctions have a depth of 0.3 to 0.6 microns and a surface doping concentration of about $8 \times 10^{21}/cm^3$.

In step 207, a front surface passivation and anti-reflection (AR) dielectric layer 105 is deposited as well as a back surface passivation and AR dielectric layer 107, each layer preferably being approximately 76 nanometers thick. In the exemplary embodiment, layers 105 and 107 are comprised of silicon nitride with an index of refraction of 2.07. In an alternate embodiment, layers 105 and 107 are comprised of silicon oxynitride. In another alternate embodiment, layers 105 and 107 are comprised of a stack of two layers of different composition, for example 10 nanometers of silicon dioxide and 70 nanometers of silicon nitride. Layers 105 and 107 are preferably deposited at a temperature of 300° C. to 400° C.

After deposition of the dielectric layers, contact grids are applied to the front and back surfaces of BSC 100 (step 209), for example using a screen printing process. In the exemplary embodiment, front contact grid 109 is comprised of silver while back contact grid 111 is comprised of aluminum. In the preferred embodiment, both the front and back contact grids are aligned and use the same contact size and spacing, with electrodes being approximately 100 microns wide, 15 microns thick and spaced approximately 2.5 millimeters apart. In at least one alternate embodiment, the back contact grid uses a finer spacing in order to lessen resistance losses from lateral current flow in the substrate. Lastly, a contact firing step 211 is performed, preferably at a peak temperature of 750° C. for 3 seconds in air. As a result of this process, contacts 109 alloy through passivation and AR dielectric coating 105 to $n^+$ layer 103. Contacts 111 alloy through passivation and AR dielectric coating 107 and back diffused layer 104 to form contact to substrate 101. As aluminum is a p-type dopant, a diode forms between back diffused layer 104 and contact 111 so that current does not flow from the back diffused layer into the contact and the back diffusion is floating. This isolates the back surface from the bulk 101 since there is zero current into a floating junction.

Figure 3:
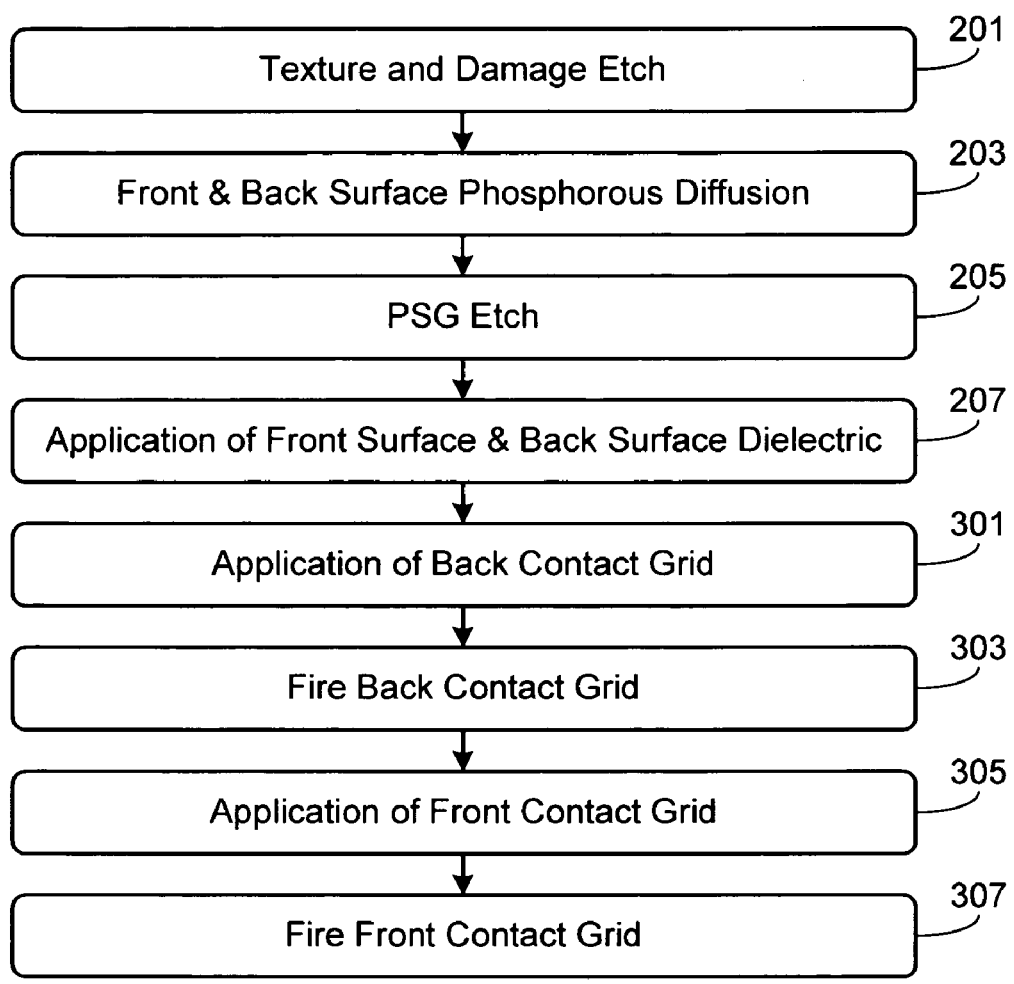
FIG. 3 illustrates an alternate process flow for the BSC of FIG. 1.

FIG. 3 illustrates an alternate process for fabricating cell 100. As illustrated, in this process the front surface and back surface contact grids are applied and fired separately, thereby allowing different firing conditions to be used for each grid. Preferably contact grid 111 is applied (step 301) and fired (step 303) first, followed by the application of contact grid 109 (step 305) and firing of the front contact grid (step 307).

Figure 4:
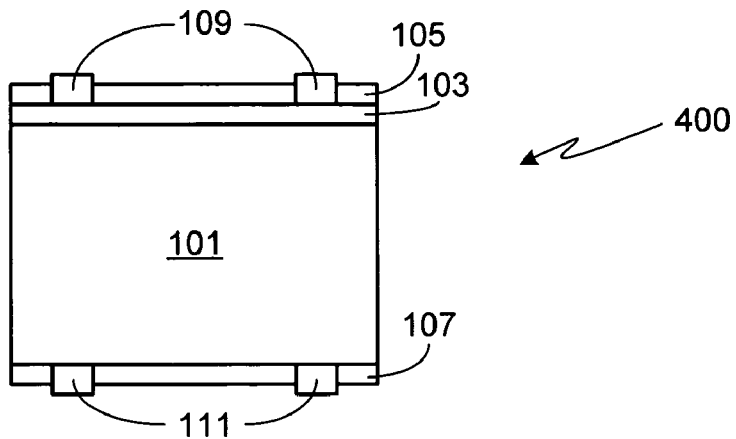
FIG. 4 illustrates an alternate embodiment of a BSC in accordance with the invention.
Figure 5:
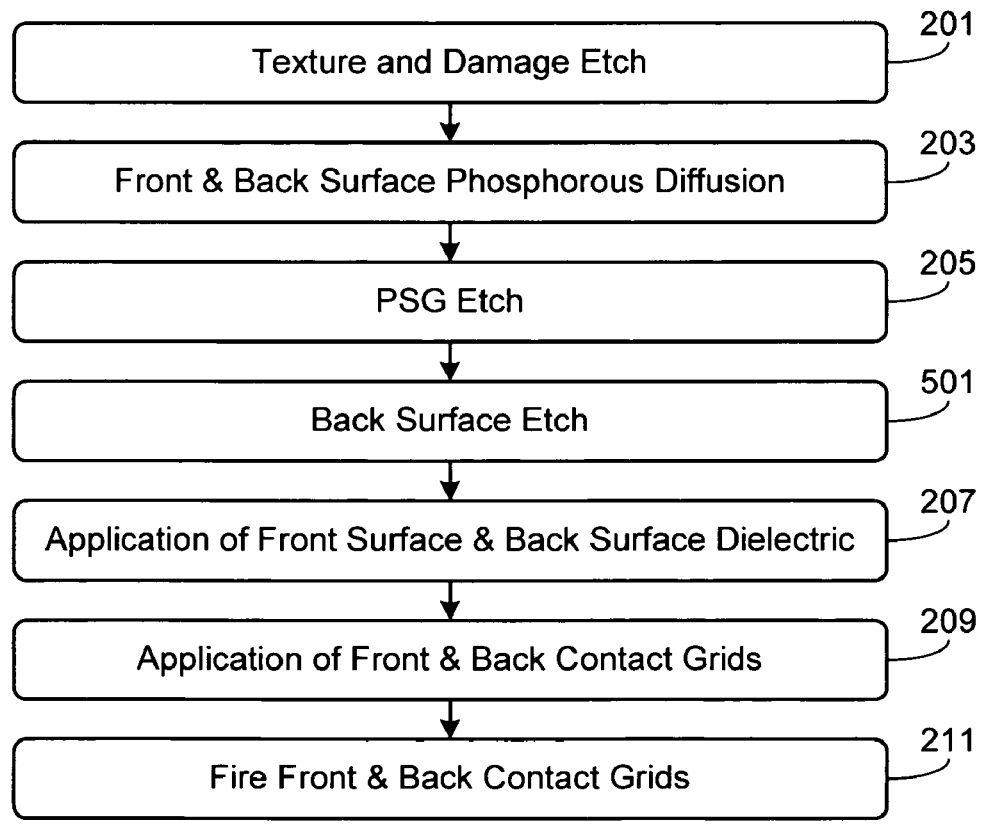
FIG. 5 illustrates the process flow for the BSC of FIG. 4.

FIGS. 4 and 5 illustrate an alternate embodiment in which the floating junction on the back surface of the substrate is removed. In structure 400, after formation of the front junction and PSG etching, the back surface of substrate 101 is etched (step 501), thereby removing the back surface junction and providing isolation for the front junction. In a preferred embodiment, step 501 uses an isotropic wet silicon etch such as a mixture of nitric acid and HF acid. After removal of the back surface floating junction, the process continues as previously described relative to either FIGS. 2 and 3. Preferably in this embodiment the back surface contact grid is comprised of an aluminum-silver mixture.

Figure 6:
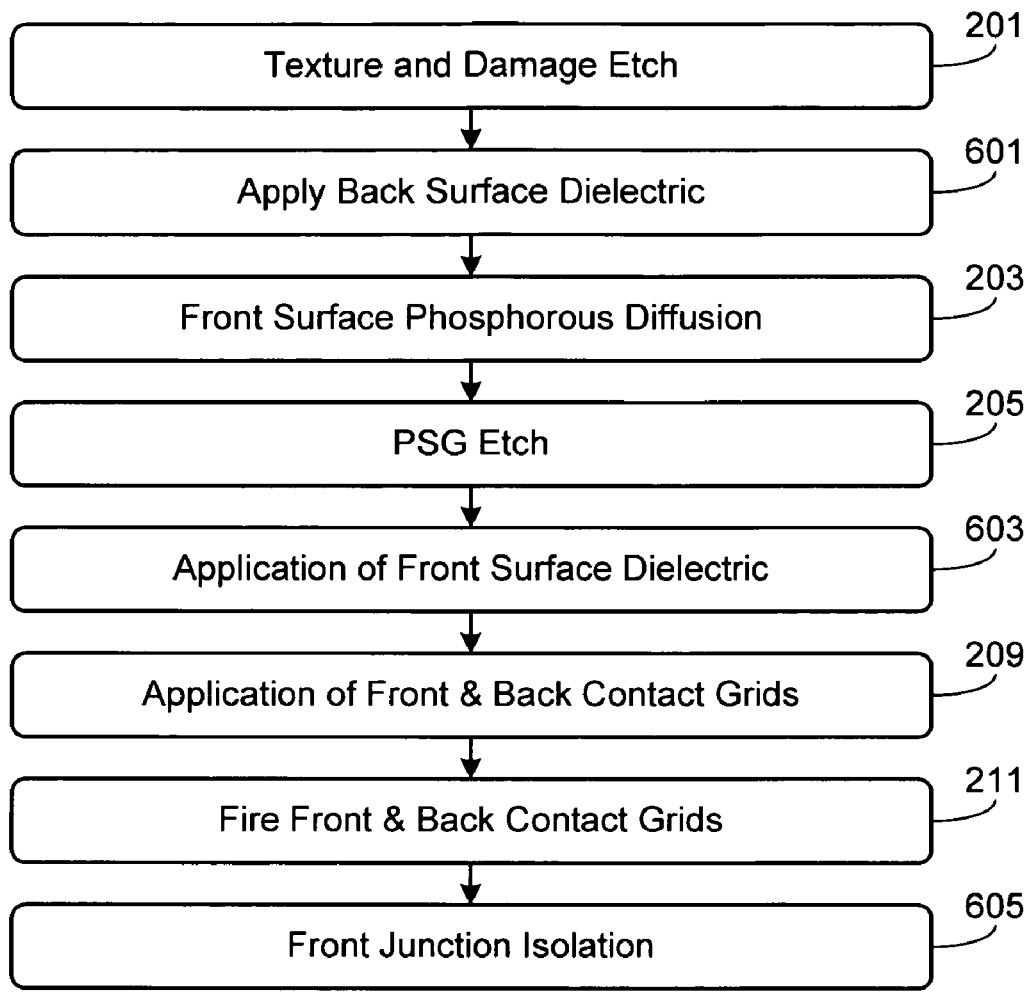
FIG. 6 illustrates an alternate process flow for the BSC of FIG. 4.

FIG. 6 illustrates an alternate process for fabricating cell 400. In this process, after preparation of substrate 101 (step 201), dielectric layer 107 is applied to the back surface of substrate 101 (step 601). As previously described, preferably dielectric layer 107 is comprised of silicon nitride or silicon oxynitride. Applying dielectric layer 107 prior to diffusing the front surface $n^+$ layer 103 (step 203) prevents the formation of a back surface junction. After the front surface diffusion (step 203) and the PSG etch (step 205), the front surface passivation and AR dielectric layer 105 is deposited (step 603), followed by application (step 209) and firing (step 211) of the contact grids. Lastly, the front junction is isolated (step 605), for example using a laser scriber to form a groove on the front cell surface around the periphery of the cell. This embodiment can also separate the screen printing and firing of the front and back surface contact grids as described relative to FIG. 3.

Figure 7:
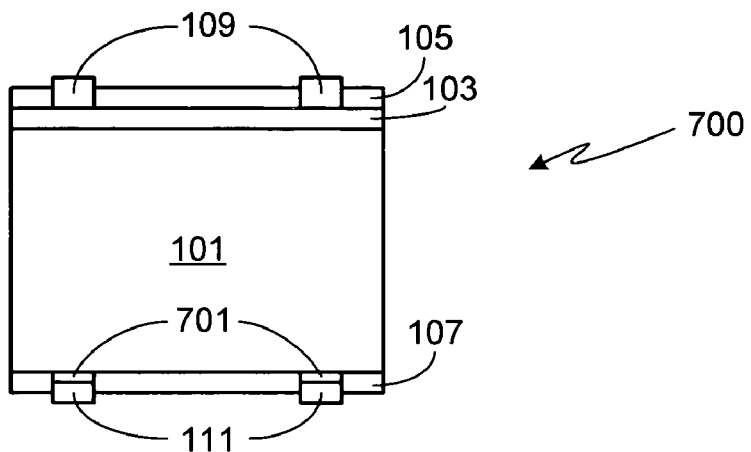
FIG. 7 illustrates an alternate embodiment of a BSC in accordance with the invention.
Figure 8:
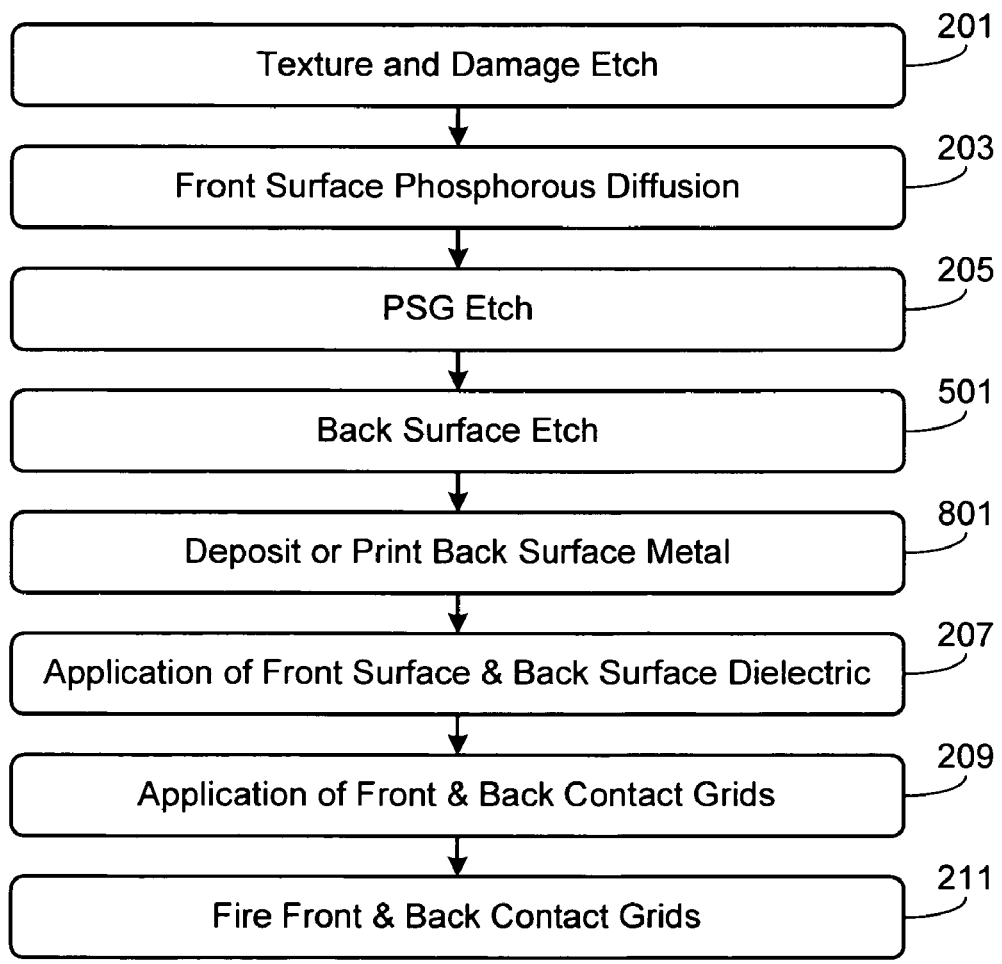
FIG. 8 illustrates the process flow for the BSC of FIG. 7.

FIGS. 7 and 8 illustrate a variation of BFC 400. As shown in the BFC cross-sectional view of BFC 700, a metal grid 701 is applied directly onto the back surface of cell 101 (step 801), thereby reducing contact resistance. Step 801 is preferably performed after the back surface of substrate 101 has been etched to remove the back surface junction and isolate the front junction (step 501). Step 801 is performed using either a deposition process with a shadow mask, or using a screen printing process. Preferably, metal grid 701 is comprised of aluminum. After depositing dielectric layers 105 and 107 (step 207), contact grids 109 and 111 are applied and fired, either together as shown in FIG. 6 and described relative to FIG. 2, or separately as described relative to FIG. 3. Regardless of whether the contact formation process follows that shown in FIG. 2 or FIG. 3, it will be understood that back surface contact grid 111 is registered to metal grid 501. During the firing step, contact grid 111 alloys to metal grid 501.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention.

What is claimed is:

1. A method of fabricating a bifacial solar cell, the method comprising the steps of:
    diffusing phosphorous onto a front surface of a silicon substrate to form a front surface junction and onto a back surface of said silicon to form a back surface junction;
    removing a phosphor-silicate glass (PSG) formed during said phosphorous diffusing step;
    removing said back surface junction and isolating said front surface junction;
    depositing a front surface passivation and anti-reflection (AR) dielectric layer onto said front surface junction and a back surface passivation and AR dielectric layer onto said back surface of said silicon substrate;
    applying a back surface metal grid onto said back surface of said silicon substrate, wherein said back surface metal grid applying step is performed after said back surface junction removing step and before said back surface passivation and AR dielectric layer depositing step;
    applying a back surface contact grid, and aligning said back surface contact grid with said back surface metal grid;
    applying a front surface contact grid;
    firing said back surface contact grid; and
    firing said front surface contact grid.

2. The method of claim 1, wherein said step of applying said back surface contact grid further comprises the step of screen printing said back surface contact grid, and wherein said step of applying said front surface contact grid further comprises the step of screen printing said front surface contact grid.

3. The method of claim 1, wherein said step of firing said back surface contact grid further comprises the step of firing said back surface grid through said back surface passivation and AR dielectric layer and through said back surface junction to form a floating back surface junction.

4. The method of claim 1, wherein said back surface junction removing step further comprises the step of etching said back surface.

5. The method of claim 1, wherein said back surface metal grid applying step further comprises the step of depositing said back surface metal grid through a shadow mask onto said back surface of said silicon substrate.

6. The method of claim 1, wherein said back surface metal grid applying step further comprises the step of screen printing said back surface metal grid onto said back surface of said silicon substrate.

7. The method of claim 1, wherein said step of firing said back surface contact grid is performed prior to said step of applying said front surface contact grid.

8. The method of claim 1, wherein said steps of firing said back and front surface contact grids are performed simultaneously.

9. The method of claim 1, wherein said step of firing said back surface contact grid is performed prior to said step of applying said front surface contact grid.

10. The method of claim 1, wherein said PSG removing step further comprises the step of etching said front surface with a hydrofluoric acid etch.

11. A method of fabricating a bifacial solar cell, the method comprising the steps of:
    depositing a dielectric layer onto a back surface of a silicon substrate;
    diffusing phosphorous onto a front surface of said silicon substrate to form an $n^+$ layer and a front surface junction;
    removing a phosphor-silicate glass (PSG) formed during said phosphorous diffusing step;
    depositing a front surface passivation and anti-reflection (AR) dielectric layer onto said $n^+$ layer;
    applying a back surface metal grid onto said back surface of said silicon substrate;
    applying a back surface contact grid, and aligning said back surface contact grid with said back surface metal grid;
    applying a front surface contact grid;
    firing said back surface contact grid;
    firing said front surface contact grid; and
    isolating said front surface junction.

12. The method of claim 11, wherein said step of applying said back surface contact grid further comprises the step of screen printing said back surface contact grid, and wherein said step of applying said front surface contact grid further comprises the step of screen printing said front surface contact grid.

13. The method of claim 11, wherein said step of isolating said front surface junction is performed using a laser scriber.

14. The method of claim 11, wherein said steps of firing said back and front surface contact grids are performed simultaneously.

15. The method of claim 11, wherein said step of firing said back surface contact grid is performed prior to said step of applying said front surface contact grid.

16. The method of claim 11, wherein said PSG removing step further comprises the step of etching said front surface with a hydrofluoric etch.

* * * * *